(12) United States Patent
Yuasa et al.

(10) Patent No.: US 6,478,585 B2
(45) Date of Patent: Nov. 12, 2002

(54) ELECTRICAL CONNECTION BOX FOR A VEHICLE

(75) Inventors: Eriko Yuasa, Yokkaichi (JP); Shinshu Kato, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 0 days.

(21) Appl. No.: 09/944,219

(22) Filed: Sep. 4, 2001

(65) Prior Publication Data

US 2002/0028591 A1 Mar. 7, 2002

(30) Foreign Application Priority Data

Sep. 5, 2000 (JP) .......................... 2000-268301

(51) Int. Cl.$^7$ .................... H01R 12/00; H05K 1/00
(52) U.S. Cl. .................. 439/76.2; 439/732; 439/949
(58) Field of Search .................. 439/76.2, 949, 439/45, 732

(56) References Cited

U.S. PATENT DOCUMENTS

| | | | |
|---|---|---|---|
| 4,781,600 A | 11/1988 | Sugiyama et al. | 439/45 |
| 4,959,018 A | 9/1990 | Yamamoto et al. | 439/76.2 |
| 5,160,274 A | * 11/1992 | Ozaki et al. | 439/949 |
| 5,618,186 A | * 4/1997 | Saka et al. | 439/76.2 |
| 6,008,982 A | 12/1999 | Smith | 361/624 |
| 6,261,105 B1 | * 7/2001 | Uezono | 439/76.2 |

FOREIGN PATENT DOCUMENTS

| | | |
|---|---|---|
| EP | 0713234 A2 | 5/1996 |
| EP | 0713234 A3 | 3/1998 |

OTHER PUBLICATIONS

Pitcher, G.: "Stepping Up The Voltage," New Electronics, International Thomson Publishing, London, GB, vol. 32, No. 1, Dec. 14, 1999, pp. 61–62, XP000945954.

\* cited by examiner

Primary Examiner—Neil Abrams
Assistant Examiner—Hae Moon Hyeon
(74) Attorney, Agent, or Firm—Oliff & Berridge, PLC

(57) ABSTRACT

An electrical connection box for use in a vehicle has bus bars in a casing with upstanding connection tabs which are alongside and spaced from each other. Insulation resin embeds the tabs while leaving exposed projecting portions. A connector attached to the casing has a housing containing terminals respectively engaged with the projecting portions of the tabs. The resin material provides a recess located between the tabs and the housing of said connector has a partition wall of insulating material which lies between the terminals and extends into the recess, to prevent leak current between the terminals.

6 Claims, 4 Drawing Sheets

ELECTRICAL CONNECTION BOX FOR A VEHICLE

BACKGROUND OF THE INVENTION

1. Field of Invention

The present invention relates to an electrical connection box which is suitable to be mounted on a vehicle, such as an automobile, and is adapted to have a relatively high voltage applied to it. The invention also relates to a vehicle including such an electrical connection box.

2. Description of Related Art

Normally one secondary, i.e. rechargeable, battery having a rated voltage of 12V and a maximum nominal voltage of 14V is mounted on an automobile of the internal combustion engine type. A voltage up to the maximum voltage of 14V is applied from the battery to a circuit composed of bus bars and the like that are accommodated in an electrical connection box. The power supply is distributed by the internal circuit of the electrical connection box. The operation of electric/electronic component parts mounted on the vehicle is controlled through electric wires connected with the internal circuit.

On a goods vehicle, such as a lorry or truck, a rated voltage of 24V and a maximum voltage of 28V are applied to a circuit by a battery structure.

In recent years, electric/electronic component parts have been mounted in increasing numbers on a vehicle, and there is an increase in the electric current which is applied to one electric/electronic component part. For example, the electric power required to drive a fan is conventionally 130 watts, but has become 260 watts in recent years. At the rated voltage of 12V of the battery, it is impossible to operate suction and exhaust devices of an engine, an electromotive power steering, and the like devices, requiring a high voltage such as 36V. Therefore, they are mechanically operated by the driving force of the engine.

With the increase of the electric current applied to each electric/electronic component part, the diameter of the electric wires used has become larger. Further, with rapid increase of the number of electric/electronic component parts, the number of electric wires has increased recently, which has increased the diameter of a wire harness having a bundle of electric wires. Consequently, the weight of the electric wires to be wired on a vehicle body has increased.

As described above, if the power supply from the battery is incapable of operating the suction and exhaust devices of the engine, they are mechanically operated. In this case, it is impossible to accomplish fine control of the operation of the suction and exhaust devices. Further much fuel is consumed, which pollutes the environment. Accordingly, it is preferable to operate the suction and exhaust devices of the engine and the like not mechanically but electrically by the power supply from the battery.

In the case where the circuit is so constructed that a voltage higher than 14V can be applied to the circuit of the electrical connection box composed of bus bars and the like, it is possible to reduce the required electric current and thus the diameter of the electric wires and the size of a bundle of a plurality of electric wires (wire harness). Therefore, it is possible to reduce the weight of the electric wires.

Further, with the application of a high voltage to the circuit composed of bus bars and the like, it is possible to control the operation of the suction and exhaust devices, the power steering motor, and the like not mechanically or hydraulically but electrically. In this case, it is possible to accomplish fine control of the operation of suction and exhaust devices and the like. Further, fuel consumption can be reduced, which reduces pollution.

It is preferable to apply a high voltage of about 42V to the electromotive power steering motor, the suction and exhaust devices of the engine, the fan, and other devices requiring a high voltage. On the other hand, in an automobile, it is preferable to apply the rated voltage of 12V (maximum voltage: 14V) to signal-generating devices of the electric/electrical components, parts and coils of relays.

However, if the electrical connection box for distributing the power supply is provided with a circuit to which a low voltage up to the maximum voltage of 14V (28V in a truck) is applied and with a circuit to which a high voltage of about 42V is applied, a leak current is liable to be generated between the two circuits owing to the potential difference. Such a leak current may particularly occur if water or dirt enters the electrical connection box. The leak current is also liable to be generated in the circuit to which the high voltage of about 42V is applied.

A leak current is liable to be generated between adjacent terminals in a connector attached to the electrical connection box, if the distance between the terminals is short, in the case where one of adjacent terminals disposed in a connector is connected to a bus bar to which a high voltage is applied and the other terminal is connected to a bus bar to which a low voltage is applied, and also in the case where two terminals disposed in the connector are connected to bus bars to which high voltages are applied.

SUMMARY OF THE INVENTION

The present invention seeks to mitigate the problem of leak currents in the connector described above. Therefore, it is an object of the present invention to prevent generation of leak currents in an electrical connection box which is provided with a circuit to which a low voltage is applied and a high voltage is applied, or a circuit to which a high voltage is applied.

According to the invention, there is provided an assembly comprising an electrical connection box and a connector. The electrical connection box has a casing having a connector-receiving portion adapted to receive a connector, at least one first bus bar mounted in the casing and having an upstanding connection tab, at least one second bus bar mounted in the casing and having an upstanding connection tab arranged alongside and spaced from the connection tab of the first bus bar, and insulation resin material embedding the connection tabs of said first and second bus bars while leaving exposed projecting portions thereof, the resin material further providing a recess located between the connection tabs.

The connector has first and second terminals engaged respectively to the projecting portions of the connection tabs of the first and second bus bars, and a housing in which the first and second terminals are mounted and which is received at the connector-receiving portion of said casing, the housing having a partition wall of insulating material which lies between the first and second terminals and extends into the recess of said insulation material.

In a first embodiment, the first bus bar is adapted to be connected in use to a first voltage source having a nominal maximum output voltage selected from 14V and 28V, and the second bus bar is adapted to be connected in use to a second voltage source having a nominal maximum output voltage higher than that of said first voltage source and not more than 200V.

In a second embodiment, the first and second bus bars are both adapted to be connected in use to a voltage source having a nominal maximum output voltage of not less than 14V, e.g. 28V or more.

It is preferable to embed each of the bus bars in an insulation body, such as an insulation plate which embeds the entire bus bar except projecting tab portion or portions thereof. For example, the root portion of each of the tabs is embedded in insulation resin, while portions of the tabs which fit in the terminals connected to electric wires are exposed.

The partition wall separates the terminals that are disposed in the connector and connected to the tabs, and extends to between the insulation resin portions covering the root portion of the tabs. Thus, it is possible to prevent a leak current from being generated between the adjacent terminals connected to the bus bars.

The bus bars may be fixed to a resin substrate by inserting a rib or spigot projecting from the substrate and deforming the rib, and then covering the substrate with a resin embedding the bus bars by molding.

It is preferable that the high voltage to be applied to the high-voltage bus bar is 42V. This is partly because it is easy to obtain a maximum nominal voltage of 42V by connecting in series three batteries each having a rated voltage of 12V (maximum voltage: 14V) of the type conventionally used in an automobile. Needless to say, it is possible to use a single battery having a maximum voltage of 42V. A second reason is because using a voltage close to 50V or above for the high-voltage bus bar is possibly dangerous. The present inventors have conducted salt water experiments in order to ascertain the degree of risk when applying a voltage of 42V in an electrical junction box suitable for use in an automobile engine compartment. Details of the experiments are given as follows:

1 ml of salt water was injected into each terminal hole of the casing of a junction box which had bus bars disposed inside. Electrical components such as relay, fuse, connectors, etc. were mounted on the casing. A voltage of 42V was applied to bus bars of the junction box for 8 hours and then suspended for 16 hours. This was repeated twice. There was initially no change to the bus bars and electrical components. After the third repetition, it was found that extra electric current passed between the bus bars generating heat, and a portion of bus bars was melted. The heat also melted resin around bus bars such as an insulation plate, casing and resin portion of electrical components adjacent the casing.

Accordingly, since damage did not occur until after the third exposure to salt water, it was confirmed that in consideration of conditions under normal use of an automobile, the application of the electric power at 42V to the electric/electronic component parts should not cause a problem.

BRIEF DESCRIPTION OF THE DRAWINGS

Embodiments of the present invention will now be described below by way of non-limitative example with reference to the accompanying drawings, in which.

DETAILED DESCRIPTION OF PREFERRED EMBODIMENTS

Figure 1:
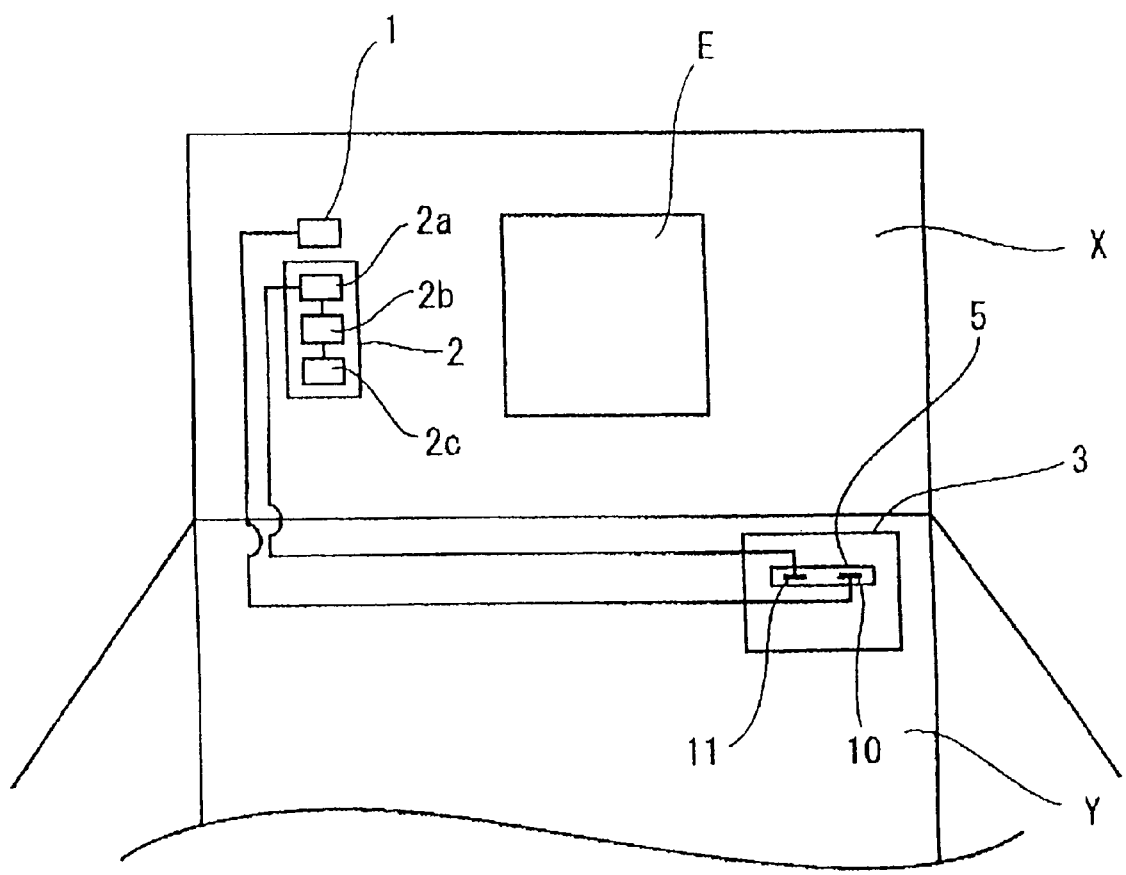
FIG. 1 is a diagrammatic view of portions of an automobile comprising an embodiment of the present invention.

As schematically shown in FIG. 1, in an automobile to which the present invention is applied, an engine E mounted in an engine compartment X is arranged to drive the automobile and generate electrical power, e.g. through a conventional alternator (not shown). A low-voltage battery structure 1 and a high-voltage battery structure 2 are mounted in the engine compartment X. The low-voltage battery structure 1 includes a conventional general-purpose battery having a rated voltage 12V and a maximum voltage of 14V. The high-voltage battery structure 2 includes three such batteries 2a, 2b, and 2c connected in series to generate a maximum voltage of 42V. Each of the three batteries 2a, 2b, and 2c has the rated voltage of 12V. Needless to say, it is possible instead to use a single battery having a maximum voltage of 42V.

The low-voltage battery structure 1 is connected to a low-voltage bus bar 10 accommodated in an electrical connection box 3 (electrical junction box) mounted in the passenger compartment Y (or, depending on the vehicle design, in the engine compartment X) to apply a low voltage (nominal maximum voltage: 14V) to the low-voltage bus bar 10.

The high-voltage battery structure 2 is connected to a high-voltage bus bar 11 accommodated in the electrical connection box 3 to apply a high voltage (nominal maximum voltage: 42V) to the high-voltage bus bar 11.

Figure 2:
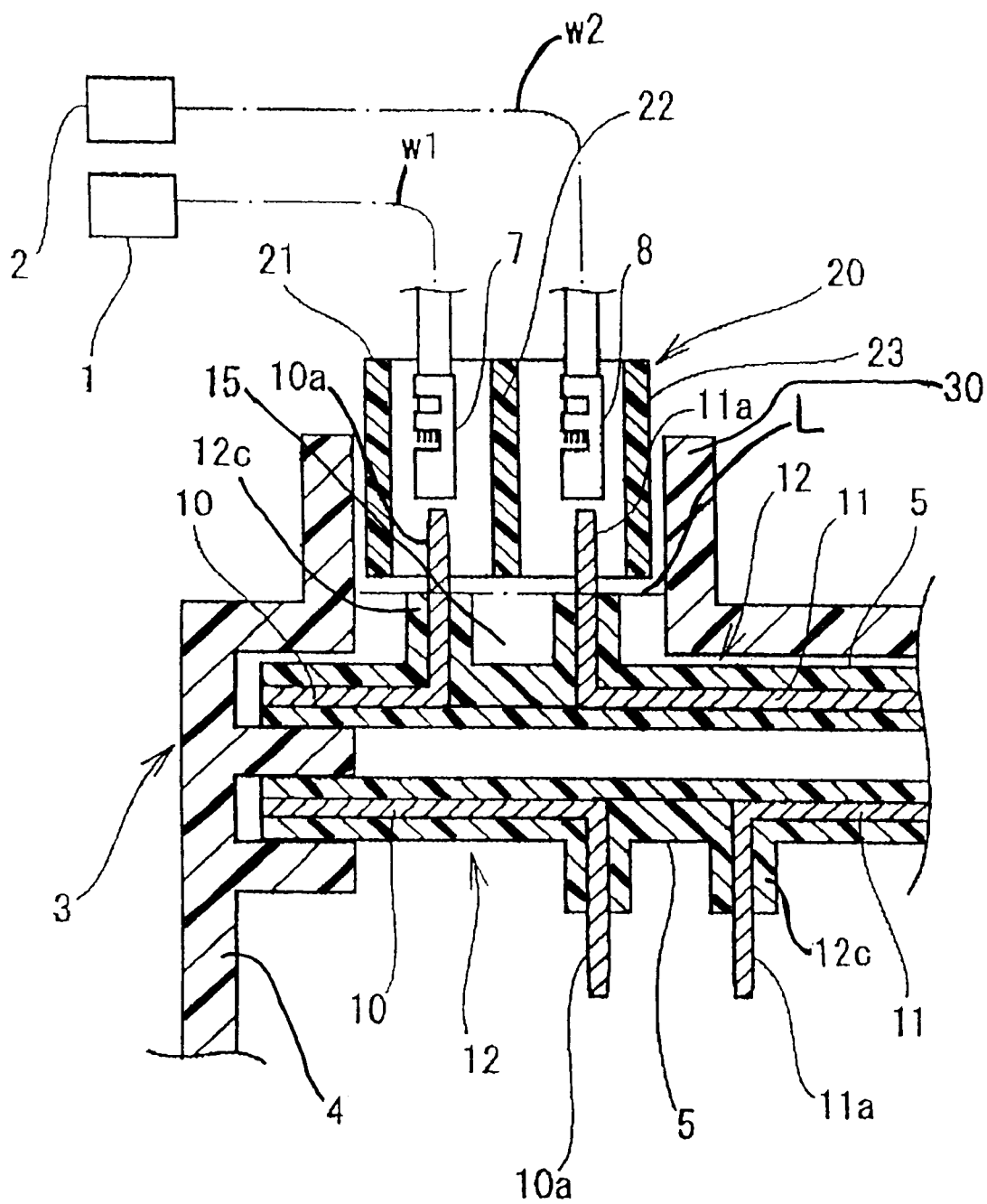
FIG. 2 is a sectional view of a part of an electrical connection box and connector, shown in FIG. 1.

As shown in FIG. 2, the electrical connection box 3 accommodates generally thin flat circuit structures 5 herein called circuits, which are stacked one above another in the molded plastics resin casing 4 of the box 3.

Figure 3A:
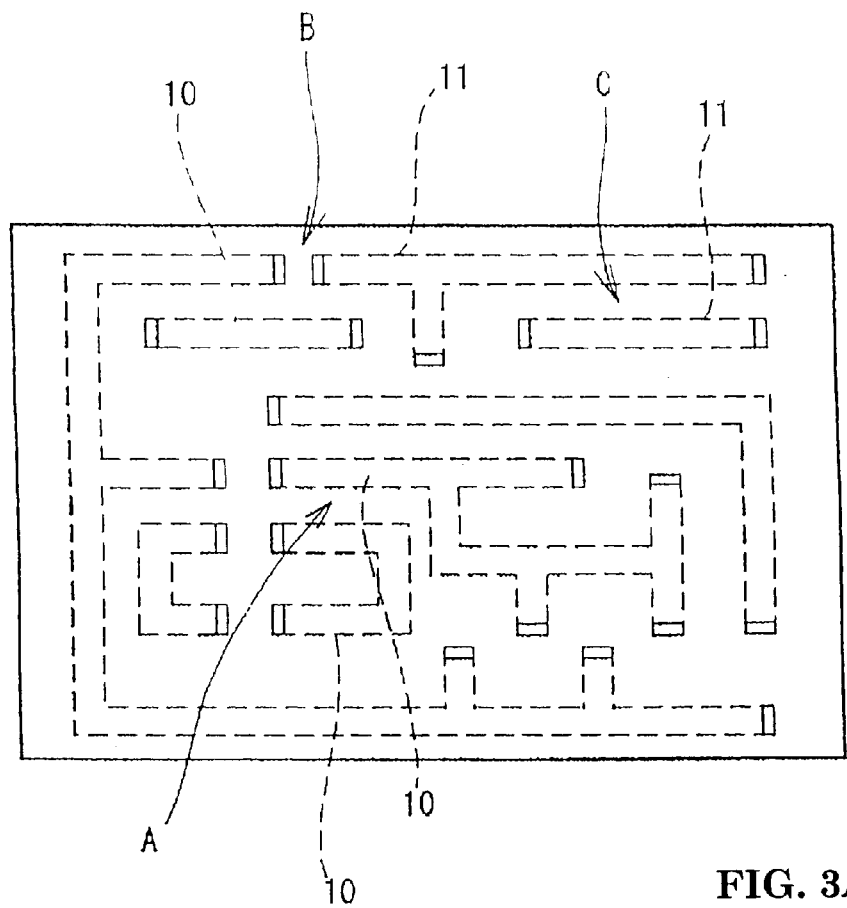
FIG. 3A is a plan view of a circuit of the electrical connection box.
Figure 3B:
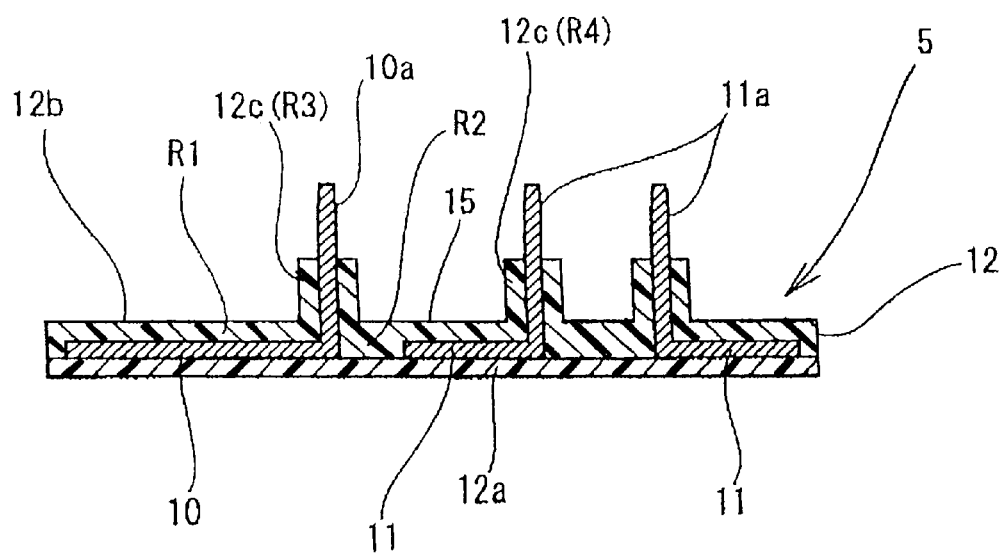
FIG. 3B is a sectional view of main parts of the circuit of FIG. 3A.

As shown in FIGS. 2–3B, each circuit 5 has an insulation construction in which low-voltage bus bars 10 and high-voltage bus bars 11 are mounted on a plastics resin insulation plate 12. In an alternative construction of the circuit 5 the bus bars 10 and 11 are molded in a body 12b of insulating resin. In FIGS. 2–3B, the entire surface of each low-voltage bus bar 10 and each high-voltage bus bar 11 is shown covered with resin portions R1, and resin portions R2 are filled between each low-voltage bus bar 10 and the high-voltage bus bar 11 adjacent thereto.

The bus bars 10 and 11 are of conductive metal strip or sheet which is cut or punched to the desired shape.

As shown in FIG. 3A, the low-voltage bus bars 10 and the high-voltage bus bars 11 are disposed at random, i.e. dispersed freely among each other, to enhance efficiency in the designing of the circuit. In other words, the bus bars 10 and 11 need not be disposed in such a way that, for example, the low-voltage bus bars 10 are collected at one side of the circuit and the high-voltage bus bars 11 are collected at the other side thereof. Therefore, a region A is present in the gap between two low-voltage bus bars 10 adjacent to each other, a region B is present in the gap between a low-voltage bus bar 10 and a high-voltage bus bar 11 adjacent each other, and a region C is present in the gap between two high-voltage bus bars 11 adjacent to each other. In any of these regions A, B, and C, the resin portion R2 is interposed between the adjacent bus bars.

Figure 4:
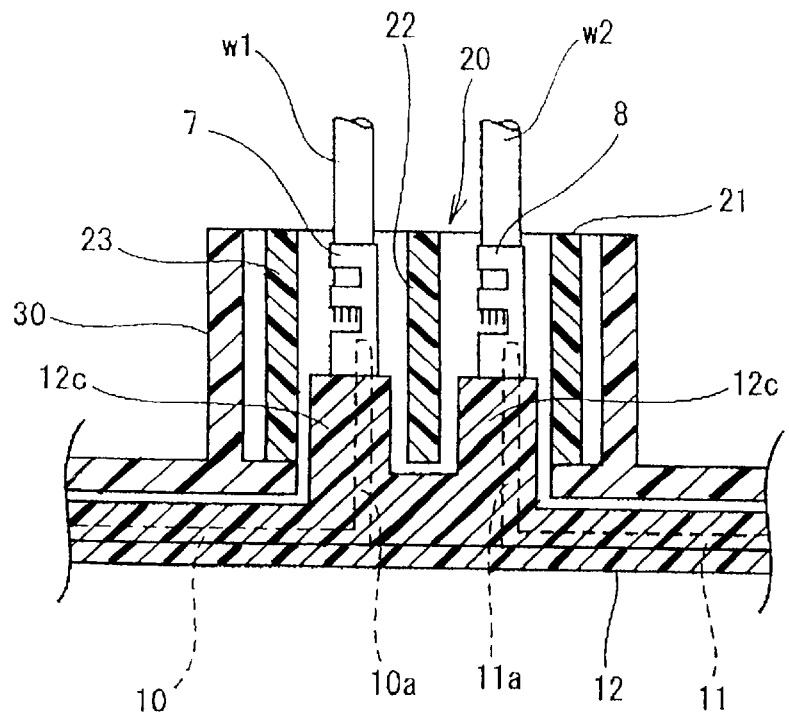
FIG. 4 is a sectional view of the box and connector of FIG. 2 in the assembled state.

Similarly to conventional bus bars, the low-voltage bus bars 10 and the high-voltage bus bars 11 are bent up to their ends to form upstanding connection tabs 10a and 11a perpendicular to the plane of the circuit 5. As shown in FIG. 2, tabs 10a and 11a are in use connected to adjacent terminals 7 and 8 disposed in a connector 20 which has a molded plastics resin housing 21 received in a connector-receiving socket 30 of the box casing 4. In this case, a leak current is liable to be generated between the adjacent tabs 10a and 11a and between the adjacent terminals 7 and 8 connected to the tabs 10a and 11a. To prevent the generation of such leak currents, the tabs 10a and 11a are embedded in the molded resin, e.g. resin portions R3 and R4 respectively shown in FIG. 4, up to a level of a terminal fit-in line L at which the tabs 10a and 11a are connected to the terminals 7 and 8 respectively. Thus, the resin has upstanding portions 12c extending up the sides of the tabs 10a and 11a from the main resin body.

As shown in FIGS. 2–3B, a recess 15 may be present between the adjacent upstanding resin portions 12c.

The connector 20 carrying the terminals 7 and 8 to be connected to the adjacent tabs 10a and 11a is fitted in the connector-receiving socket 30 formed in the casing of the electrical connection box 3. The housing 21 of the connector has a partition wall 22 separating the terminals 7 and 8 which are respectively connected to electric wires w1 and w2 (see FIG. 4). When the connector 20 is fitted in the socket 30, the partition wall 22 may be received in the recess 15 formed between the adjacent upstanding resin portions 12c. A peripheral wall 23 of the housing 21 may also be shaped to surround the upstanding resin portion 12c of the tabs 10a and 11a which the terminals 7 and 8 engage.

When the tabs 10a and 11a formed on the low-voltage bus bar 10 and the high-voltage bus bar 11 respectively are connected to the adjacent terminals 7 and 8 disposed inside the connector 20, the exposed portions of the tabs 10a and 11a are fitted in the terminals 7 and 8, respectively, whereas the root portions of the tabs 10a and 11a not fitted in the terminals 7 and 8 are covered by the resin. Further, the partition wall 22 of the connector housing 21 fits in the recess 15 formed between the resin portions 12c, thus shielding the gap between the tabs to which different voltages are applied and the gap between the terminals (7, 8). Thus it is possible to prevent or minimize the risk of the generation of a leak current.

Figure 5:
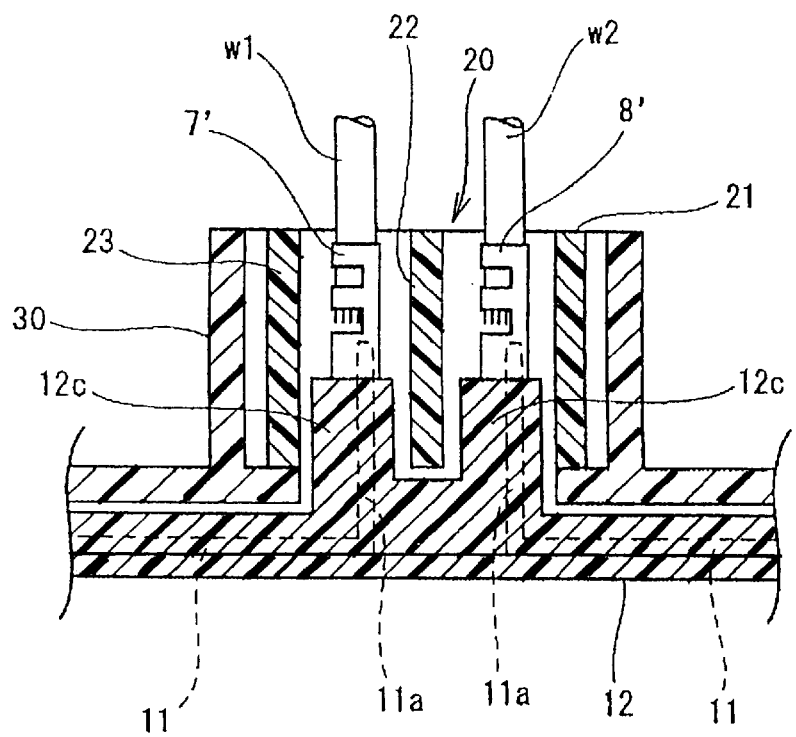
FIG. 5 is a sectional view similar to FIG. 4 showing another embodiment.

FIG. 5 shows another embodiment in which two tabs 11a of adjacent high-voltage bus bars 11 are connected to adjacent terminals 7' and 8' disposed in the connector 20. As in the above-described embodiment, the root portion of each tab 11a is embedded in the molded resin to form the upstanding resin portion 12c and define the recess 15 between the resin portions 12c. The partition wall 12 of the connector 20 extends into the recess 15 to shield the gap between the tabs 11a and 11a and the gap between the terminals 7' and 8'.

The circuits 5 of these embodiments are thus applied to an automobile on which a battery of the rated voltage of 12V is mounted. However, in the case where a maximum voltage of 28V is applied to a bus bar in the automobile or a larger vehicle, such as a truck, the bus bar to which the voltage of 28V is applied is the low-voltage bus bar and the bus bar to which a voltage of 42V (or higher) is applied is the high-voltage bus bar. The construction of the circuits 5 and connection box in this case is the same as that of the embodiments.

In the embodiments, a maximum voltage of 42V is applied to the high-voltage bus bar 11. However, needless to say, a high voltage of e.g. 42V–200V can be applied to the high-voltage bus bars 11, provided that safety is ensured.

As apparent from the foregoing description, by the present invention, a high voltage can be applied to a bus bar accommodated in the electrical connection box, so that it is possible to reduce the diameter of electric wires and the size of a wire harness by reducing the amount of electric current. When tabs of the bus bars to which different voltages are applied are connected to adjacent terminals, the root portion of each tab is embedded in the resin, and the partition wall of the connector accommodating the terminals is extended into the concavity or recess formed between adjacent resin portions covering the root portion of each tab. Thus, it is possible to prevent a leak current from being generated between the tab of the low-voltage bus bar and that of the high-voltage bus bar and between the adjacent terminals connected to the tabs.

Similarly, in the case where the tabs of the bus bars to which a high voltage is applied are adjacent to each other, the root portion of each tab is embedded in the resin, and the partition wall of the connector accommodating the terminals is extended into the concavity or recess formed between adjacent resin portions covering the root portion of each tab. Thus, it is possible to prevent a leak current from being generated between the tabs of the high-voltage bus bars and between the adjacent terminals connected to the tabs.

In the drawings, the connector 20 is shown with two terminals 7 and 8, but in practice may contain additional terminals connected to the bus bars of the box 3, provided that recesses 15 and partition walls 22 are provided at appropriate locations to achieve the desired effect of the invention.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

What is claimed is:

1. An assembly comprising an electrical connection box and a connector, said electrical connection box comprising:
   a casing having a connector-receiving portion adapted to receive said connector;
   at least one first bus bar mounted in said casing and having an upstanding connection tab;
   at least one second bus bar mounted in said casing and having an upstanding connection tab arranged alongside and spaced from said connection tab of said first bus bar; and
   insulation resin material embedding said connection tabs of said first and second bus bars while leaving exposed projecting portions thereof, said resin material further providing a recess located between said connection tabs,
   said connector comprising:
   at least first and second terminals that engage respectively to said projecting portions of said connection tabs of said first and second bus bars; and
   a housing in which said first and second terminals are mounted and which is received at said connector-receiving portion of said casing, said housing having a partition wall of insulating material which lies between said first and second terminals and extends into said recess of said insulation material.

2. An assembly according to claim 1, wherein said first bus bar is connected in use to a first voltage source having a nominal maximum output voltage selected from about 14V and about 28V, and said second bus bar is connected in use to a second voltage source having a nominal maximum output voltage higher than that of said first voltage source and not more than about 200V.

3. An assembly according to claim 1, wherein said first and second bus bars are both connected in use to a voltage source having a nominal maximum output voltage of not less than about 14V.

4. A vehicle having electrical circuitry including an assembly comprising an electrical connection box and a connector, said electrical connection box comprising:

- a casing having a connector-receiving portion adapted to receive said connector;
- at least one first bus bar mounted in said casing and having an upstanding connection tab;
- at least one second bus bar mounted in said casing and having an upstanding connection tab arranged alongside and spaced from said connection tab of said first bus bar; and
- insulation resin material embedding said connection tabs of said first and second bus bars while leaving exposed projecting portions thereof, said resin material further providing a recess located between said connection tabs, said connector comprising:
  - at least first and second terminals that engage respectively to said projecting portions of said connection tabs of said first and second bus bars; and
  - a housing in which said first and second terminals are mounted and which is received at said connector-receiving portion of said casing, said housing having a partition wall of insulating material which lies between said first and second terminals and extends into said recess of said insulation material.

5. A vehicle according to claim 4, having a first voltage source having a nominal maximum output voltage selected from about 14V and about 28V connected to said first bus bar, and a second voltage source having a nominal maximum output voltage higher than that of said first voltage source and not more than about 200V connected to said second bus bar.

6. A vehicle according to claim 5, having a voltage source having a nominal maximum output voltage of at least about 14V connected to both said first and second bus bars.

* * * * *